United States Patent [19]

Lunquist et al.

[11] 3,745,430

[45] July 10, 1973

[54] THICK FILM FEED-THROUGH CAPACITOR

[75] Inventors: Richard E. Lunquist, Pompano Beach; William J. Kerr, Fort Lauderdale, both of Fla.

[73] Assignee: Motorola, Inc., Franklin Park, Ill.

[22] Filed: Dec. 21, 1971

[21] Appl. No.: 210,536

[52] U.S. Cl. ....... 317/256, 317/101 C, 317/101 CC

[51] Int. Cl. ........ H01g 1/00

[58] Field of Search ........ 317/256, 258, 261, 317/101 C, 101 CC; 333/79

[56] References Cited

UNITED STATES PATENTS

| | | | |
|---|---|---|---|
| 2,694,185 | 11/1954 | Kodama | 317/256 X |
| 2,759,854 | 8/1956 | Kilby | 317/101 C |
| 2,871,428 | 1/1959 | Shen | 317/261 UX |
| 2,877,389 | 3/1959 | Wiener | 317/101 C |
| 3,179,855 | 4/1965 | Brombaugh | 317/101 C |
| 3,560,256 | 2/1971 | Abrams | 317/101 CC |

*Primary Examiner*—E. A. Goldberg
*Attorney*—Foorman L. Mueller, George Aichele et al.

[57] ABSTRACT

A feed-through capacitor deposited in a thick film on a flat, thin alumina substrate having an active circuit and a capacitor. The capacitor includes a bottom electrode of metallized film on the surface of the substrate, a layer of dielectric having a high-dielectric constant, and a top electrode of metallized film deposited on the dielectric. The bottom electrode film has a terminal portion for connection to ground reference potential and a lead film connected to the active circuit, the same extending around the edge of the substrate with the active circuit on the opposite side thereof. The top electrode film may be singular or multiple in nature, having an external terminal at one edge of each electrode and a lead film at the opposite edge connected to the active circuit, the same extending around the edge of the substrate with the active circuit on the opposite side of the substrate.

12 Claims, 5 Drawing Figures

PATENTED JUL 10 1973

3,745,430

THICK FILM FEED-THROUGH CAPACITOR

BACKGROUND OF THE INVENTION

In miniature electronic circuits provided as thick film on a substrate, there is a problem of providing the required feed-through capacitors in a small place and in a unitized structure with the other components. Most known discrete feed-through capacitors require more space than is available. Although low pass filters and discrete capacitors provided on thin substrates by thick film deposition are known, maintaining sufficiently low "lead" inductance for good radio frequency attenuation has been a problem. Leads for these capacitors have produced sufficient inductance to affect the RF attenuation effectiveness of the capacitors. In addition, shielding th integrated circuit chip from the capacitors to prevent stray capacitance from affecting the operation of th active circuit, can provide an additional problem. Where shielding is, however, accomplished, the problem of adequate attenuation of radio frequency signals may remain. Since IC's are often DC coupled between stages RF energy is more of a problem than with AC coupling. Re-biasing due to RF in the first stage is multiplied by the gain of the stage and presents a much larger error to the next stage. In addition, stray capacitance problems become more acute with limitations on physical volume.

SUMMARY OF THE INVENTION

It is an object of the present invention to provide an improved capacitor structure for radio frequency isolation for a thick film module including an integrated circuit on a substrate.

It is another object of the present invention to provide a capacitor with substantially zero inductance for a thick film module including an integrated circuit chip.

It is a further object of the present invention to shield an integrated circuit chip from stray capacitance produced by capacitors connected thereto.

In the audio portion of a transmitter a hybrid module includes four feed-through capacitors formed on one surface of the flat, thin alumina substrate and an active thick film circuit having a pad for receiving an integrated circuit chip formed on the opposite, or same, surface of the substrate. The capacitors have a common bottom electrode painted or deposited on the surface of the substrate, with a dielectric painted or deposited thereon followed by four top electrodes painted or deposited on the surface of the dielectric. The common electrode is connected at one edge thereof to an external terminal adapted to be connected to a ground reference potential, while the opposite edge of the common electrode is connected by a lead film deposited on the substrate to the active circuit, the lead extending around the edge with the active circuit on the opposite side of the substrate. Each of the top electrodes has an external terminal at one edge thereof and a lead film connected to the opposite edge of the electrode and extends around the edge of the substrate for connection to the active circuit with the active circuit on the opposite side of the substrate. Pins through the substrate, plated through holes, or some other such connections may be used in place of depositing the lead on the edge of the substrate.

DETAILED DESCRIPTION

Figure 1:
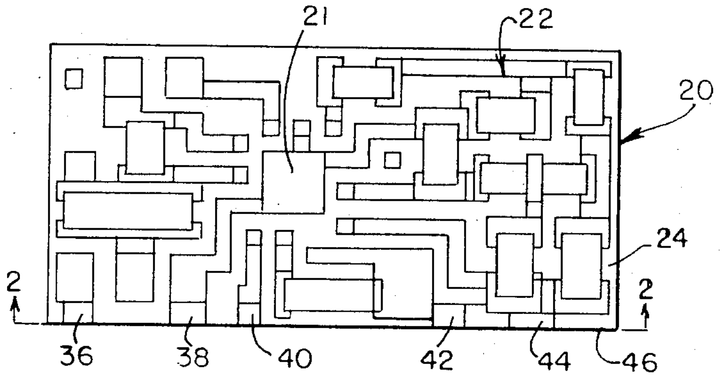
FIG. 1 is a plan view of the active circuit surface of a hybrid module including the thick film capacitors of the present invention.
Figure 2:
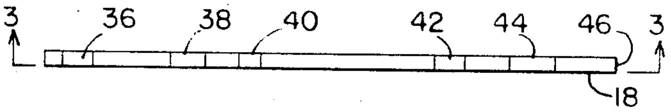
FIG. 2 is a front plan view of FIG. 1 taken along lines 2—2 showing the leads extending around the edge of the substrate from the capacitors to the active circuit.
Figure 3:
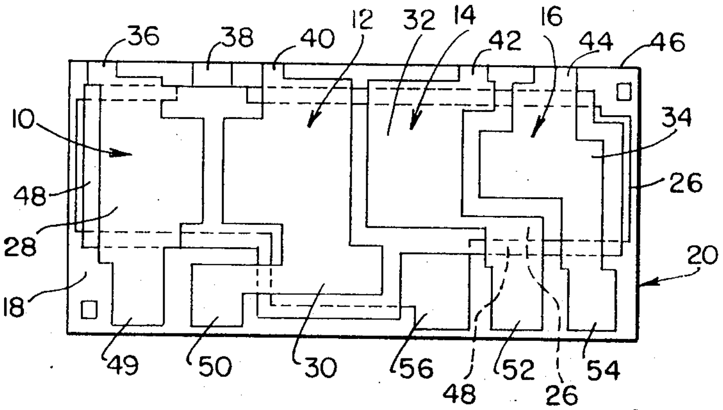
FIG. 3 is a plan view of FIG. 2 taken along lines 3—3 showing the opposite surface of the substrate with the capacitors of the present invention.

In the audio portion of a transmitter, a hybrid module as shown in FIGS. 1, 2 and 3 may be used. This module includes four feed-through capacitors 10, 12, 14, and 16 (FIG. 3), which are deposited on one surface 18 of a flat, thin alumina substrate 20 and which bypass signals to the ground electrode for good RF (10 to 1000 MHz) attenuation. In one embodiment the substrate is 750 mils long, 350 mils wide and 25 mils thick. An active thick film circuit 22 including a pad 21 for receiving an integrated circuit chip is deposited on the opposite surface 24. The active circuit could be deposited on the same surface if physically separated from the capacitors. The substrate may be made of alumina having a dielectric constant of the order of 9, or of some other material having a low dielectric constant, such as a ceramic. The bottom electrode 26 provides isolation between the integrated circuit chip received by the pad 21 of the active thick film circuit 22, and the capacitors which are on the opposite side of the substrate.

Figure 4:
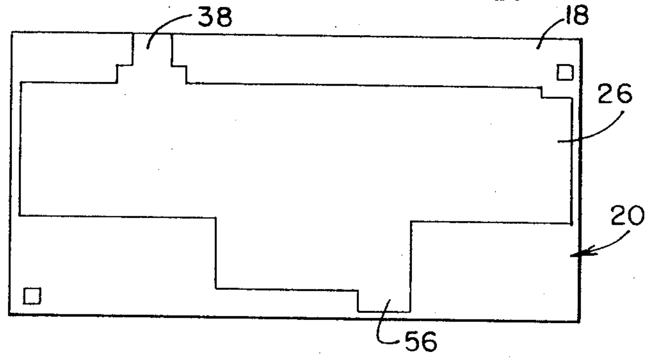
FIG. 4 is a plan view of the alumina substrate with the common electrode thereon.
Figure 5:
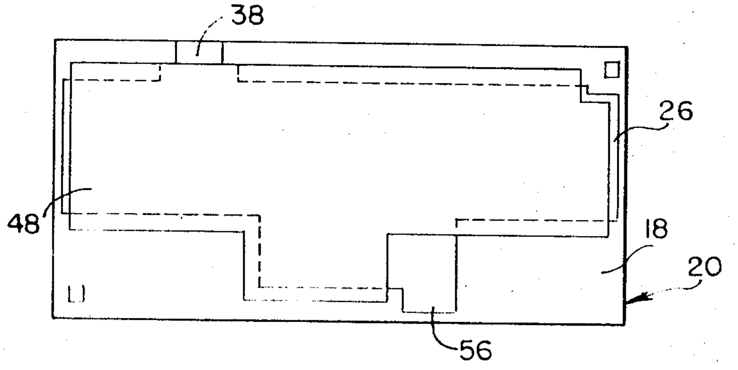
FIG. 5 is a plan view of the alumina substrate with the common electrode and dielectric thereon.

The capacitors 10, 12, 14 and 16 have a common bottom electrode 26 painted or otherwise deposited on the surface 18 of the substrate 20 (FIG. 4), a dielectric 48 (FIG. 5) deposited over the electrode 26, and top electrodes 28, 30, 32 and 34 (FIG. 3) positioned over the dielectric. The active circuit is connected to common bottom electrode 26 by lead 38 extending around the edge 46 of the substrate, while the top electrodes 28, 30, 32 and 34 are connected to the active circuit by leads 36, 40, 42 and 44 extending from the edges of the respective electrodes (FIG. 3), around the edge 46 of the substrate (FIG. 2) to the active circuit 22 (FIG. 1). Pins through the substrate, plated through holes, and other such connections may be used between a capacitor and the active circuit.

In one embodiment, the bottom electrode 26 is formed on the surface of the alumina substrate by applying a metallized film sold under the trademark DuPont Palladium/Silver Conductor Composition 8430. The dielectric layer 48 may be formed from a dielectric sold under the trademark DuPont Dielectric Composition 8229 and having a dielectric constant of from 300 to 800 (at 1 kilohertz). Finally, the four top electrodes 28, 30, 32 and 34, are formed over the electric layer 48 in the same manner as the common bottom electrode 26. Both the metallized films and the dielectric are deposited by a process well known in the art.

The top electrodes 28, 30, 32 and 34 together with the common bottom electrode 26 form the feed-through capacitors of this invention. Each feed-through capacitor has an external terminal 49, 50, 52 and 54 formed along one edge of the respective electrodes 28, 30, 32 and 34 with the terminals being connected to inputs, outputs, regulated supply potentials, signal sources and the like. At the opposite edges of the top electrodes, integral film leads 36, 40, 42 and 44, which are formed with the top electrodes, connect the top electrodes to the active circuit on the opposite side of the substrate by extending around edge 46. Lead 38 comprises a film integral with and extending from the bottom electrode 26 around the edge 46 of the substrate to the active circuit 22, while external terminal 56 on the opposite edge of the electrode 26 is adapted for connection to the ground reference potential. The capacitors provide excellent radio frequency attenuation for frequencies in the 10 to 1000 megahertz range. The external terminals 49, 50, 56, 52 and 54 of the respective electrodes 28, 30, 26, 32 and 34 are positioned opposite leads 36, 40, 38, 42 and 44, respectively. This positioning of the external terminals and leads on opposite edges of a respective electrode (FIG. 3), and the distributed structure of the capacitor electrodes, permits the low "lead" inductance necessary for good radio frequency attenuation, with the inductance of each capacitor of the present invention being near zero.

Shielding the integrated circuit chip mounted on the active circuit from the capacitors is accomplished by the common or grounded electrode 26 of each of the feed-through capacitors on the surface of the substrate between the active circuit 22 and top electrodes 28, 30, 32 and 34. This shielding prevents stray capacitance from coupling RF energy from the non-ground capacitor electrode to the active circuit. With the active circuit on the same surface of the substrate as the capacitors, shielding is unnecessary because of the physical separation of the capacitors from the active circuit.

What has been described therefore, is an improved feed-through capacitor which may be used in a small place on a flat thin substrate with the capacitor shielded from an active circuit connected thereto and providing by-pass of radio frequency signals.

We claim:

1. In an electronic assembly having a flat thin substrate of low dielectric constant material having top and bottom surfaces, and an active thick film circuit on the top surface thereof, capacitive means on the bottom surface of the substrate including in combination, first conductive electrode film means positioned on the bottom surface of the substrate, a dielectric film positioned on said first electrode film means, second conductive electrode film means positioned on said dielectric film, and conducting means connecting said second electrode film means to the active thick film circuit, said first electrode film means shielding the active thick film circuit from said capacitive means.

2. The combination according to claim 1 wherein said conducting means comprises a thin metallized film deposited on the top and bottom surfaces of the substrate and extending around the edge thereof.

3. The combination according to claim 1 including second conducting means connecting said first electrode fil means to the active thick film circuit, with said second conducting means comprising a thin metallized film deposited on the top and bottom surfaces of the substrate and extending film the edge thereof.

4. An electronic assembly including in combination, a flat thin substrate having top and bottom surfaces, an active circuit on the top surface of the substrate, capacitor means including a first electrode film positioned on the bottom surface of the substrate, conducting means connecting said first electrode film to said active circuit, said first electrode film further having an external terminal positioned on the edge of said film opposite to said film lead and adapted to be connected to a reference potential, a dielectric film positioned on said first electrode film, and second electrode film means positioned on said dielectric film and having a film lead extending around the edge of said substrate and connecting said second electrode film means to said active circuit, said second electrode film means having a terminal on the edge thereof opposite to said film lead, said first electrode film shielding said active circuit from said capacitor.

5. An electronic assembly according to claim 4 wherein said conducting means comprise film lead on the top and bottom surfaces and extending around the edge of the substrate.

6. An electronic assembly according to claim 4 wherein said substrate comprises alumina.

7. An electronic assembly according to claim 4 wherein said active circuit includes a pad for receiving an integrated circuit chip.

8. An electronic assembly including in combination, a substrate having at least one substantially flat surface, an active thick film circuit on a surface of said substrate, capacitor means including a first conductive electrode film on a surface of said substrate having first and second edges remote from each other, a dielectric film positioned on said first electrode film, and second conductive electrode film means positioned on said dielectric film, said second film means including a conducting portion having substantial area positioned above said first electrode film and having third and fourth edges remote from each other.

conducting means connecting said first edge of said first electrode film and said third edge of said second electrode film means to said active circuit, terminal means connected to said second edge of said first electrode film for connecting said active circuit to an external reference potential, and further terminal means connected to said fourth edge of said second electrode film means for connecting said active circuit to external circuitry.

9. The combination according to claim 8 wherein said second conductive electrode film means includes a plurality of separate conducting electrodes cooperating with said dielectric film and said first conductive electrode film to form a plurality of separate capacitors.

10. The combination of claim 9 wherein said conducting means connects each of said conducting electrodes to said active thick film circuit, and said further terminal means includes a plurality of terminals individually connected to said conducting electrodes.

11. The combination of claim 8 wherein a portion of said conducting means connected to said first electrode film includes a pad for receiving an integrated circuit.

12. The combination of claim 8 wherein said first conductive electrode film and said second conductive film means are formed of an alloy of palladium and silver.

* * * * *